US006323520B1

(12) United States Patent
Saha

(10) Patent No.: US 6,323,520 B1
(45) Date of Patent: *Nov. 27, 2001

(54) METHOD FOR FORMING CHANNEL-REGION DOPING PROFILE FOR SEMICONDUCTOR DEVICE

(75) Inventor: Samar Kanti Saha, Milpitas, CA (US)

(73) Assignee: VLSI Technology, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/127,582

(22) Filed: Jul. 31, 1998

(51) Int. Cl.[7] .................................................. H01L 29/76
(52) U.S. Cl. ........................... 257/345; 257/400; 257/607
(58) Field of Search .................................. 257/219, 220, 257/285, 345, 607, 399, 400, 611; 438/282, 548, 918

(56) References Cited

U.S. PATENT DOCUMENTS

| 5,208,473 | * | 5/1993 | Komori et al | 257/345 |
|---|---|---|---|---|
| 5,291,049 | * | 3/1994 | Morita | 257/335 |
| 5,466,958 | * | 11/1995 | Kakumu | 257/345 |
| 5,548,143 | * | 8/1996 | Lee | 257/269 |
| 5,557,129 | * | 9/1996 | Oda et al. | 257/345 |
| 5,583,361 | * | 12/1996 | Morishita | 257/345 |
| 5,672,890 | * | 9/1997 | Nakajima | 257/192 |
| 5,780,907 | * | 7/1998 | Ema et al. | 257/371 |
| 5,814,869 | * | 9/1998 | Dennen | 257/408 |
| 5,861,334 | * | 1/1999 | Rho | 438/282 |
| 5,880,507 | * | 3/1999 | Murakami et al. | 257/408 |

OTHER PUBLICATIONS

S. Wolf, Silicon Processing for the VLSI Era, vol. 3, pp. 232–240, 1995.*

* cited by examiner

*Primary Examiner*—Eddie Lee
*Assistant Examiner*—George C. Eckert, II
(74) *Attorney, Agent, or Firm*—Wagner Murabito & Hao LLP

(57) ABSTRACT

A method for forming a semiconductor device with a doped channel-region, and the device formed therefrom. In one embodiment, the method invention is comprised of two principal steps. The first step is to provide a semiconductor substrate to which the following process steps can be performed. The second step is to create a doping profile into the channel-region of the semiconductor substrate. The doping profile is created by a) performing a first doping implantation with a first dopant in a first concentration to a first depth within the semiconductor substrate, and b) performing a second doping implantation with a second dopant in a second concentration to a second depth within the semiconductor substrate.

4 Claims, 13 Drawing Sheets

METHOD FOR FORMING CHANNEL-REGION DOPING PROFILE FOR SEMICONDUCTOR DEVICE

TECHNICAL FIELD

The present claimed invention relates to the field of semiconductor devices. More specifically, the present claimed invention relates to a method for forming a semiconductor device having an enhanced channel-region doping profile.

BACKGROUND ART

The field-effect transistor (FET) uses the effects of an electric field to turn the current flow through the transistor on and off. Two principal FET configurations exist. The first is a semiconductor device with an NMOS configuration having an n-channel in a p-well. The second is a semiconductor device with a PMOS configuration having a p-channel in an n-well. A CMOS configuration simply pairs together an NMOS and a PMOS transistor. The principles below are applicable to both types of devices.

The transistor has two terminals that are referred to as a drain and a source. The terminals are separated by a channel region over which a gate resides. A thin layer of dielectric material, called gate oxide, separates the gate electrode from the wells. The electric field created from a relative voltage $V_{GS}$, between the gate and the source terminal either enhances or depletes the carriers in the channel region below the gate, depending on the type of device and the gate voltage. The presence or lack of these carriers directly controls the current flow (from zero to maximum amperage current) between the two terminals. The voltage, $V_{GS}$, at which a conducting channel is formed, i.e. the device turns on, is called the threshold voltage, $V_T$.

Doping the well and the channel region with impurities has a significant affect on the performance of the transistor and, for example, how and when it turns on and off. The channel region below the gate is doped with impurities having carriers that affect the current carrying capabilities.

The carrier-type of the impurity used in these locations depends on whether the semiconductor is designed as an enhancement or depletion type device. An enhancement device uses carriers in the channel opposite of those in the wells. It is the difference in carriers that prevents current flow from occurring at zero bias, $V_{GS}=0$ and that allow current flow at a positive bias, $V_{GS}>0$.

In contrast, a depletion device uses carriers in the channel that are the same as those used in the well. Because the carriers are the same, current flow occurs at zero bias between the gate and drain. Similarly, current flow is prevented at a negative bias, $V_{GS}<0$. Hence, the threshold voltage in a depletion device is negative.

Doping the channel region affects the $V_T$ characteristics. The prior art requires the channel region to be doped with an impurity-concentration that yields an acceptable $V_T$. A low $V_T$ allows leakage current through the device at the low turn-off voltage while a high $V_T$ prevents leakage current at the low turn-off voltage.

The following items refer to the performance of a transistor in the sub-threshold region. The sub-threshold region refers to the performance of the device at voltages below $V_T$. Literally, this is the region where the device is turning-off, i.e. the current through the device approaches zero. How well the device approaches zero current defines the heating and power loss due to leakage current through the device.

Referring now to Prior Art FIG. 1, a graph showing the Logarithm of $I_{ds}$, current vs. $V_{GS}$ voltage for a depletion device is presented. The initial slope 100 (in units of decade amps/mV) of the curve 102 represents how well or how quickly the current shuts off as the bias voltage to the gate changes. The inverse of this slope is called the S-factor (in units of mV/decade amps). The theoretical minimum s-factor is 60 mV/decade amps. As a benchmark, the S-factor defines how well the device turns on and off. It is desirable to have a steep S-factor for acceptable gate swing, or switching, properties. The prior art has a typical middle slope 102 value of 80–90 mV/decade amps.

The S-factor is directly proportional to the dopant concentration in the channel. For example, an increase in concentration decreases the slope. Explained another way, a higher concentration of dopant in the channel region means that a greater voltage will have to be applied to change the state of the device from on to off. Curve 104 represents a theoretical curve that the prior art desires to reach but is currently not feasible.

Focusing now on Prior Art FIG. 2, a graph showing Logarithm of Dopant concentration vs. Distance in the semiconductor substrate is presented. This graph represents the high dopant-concentration profile needed by the prior art to obtain the switching properties referred to in the previous paragraph. The curve is referred to as the standard-profile doping curve (ST-profile). Theoretically, the ideal curve 200 is desired, but in reality, only the actual curve 202 is obtainable.

Prior Art FIG. 3 is an illustration of the Electron-Dopant Scattering Interference. The Electron-Dopant interference occurs when a high concentration of dopant 300 is present in the channel-region 302 of the substrate. The high concentration of dopant is required to set the threshold voltage, $V_T$, at a reasonably high level to prevent leakage at turn-off voltage. Thus, when voltage between the two terminals increases, providing an electromotive force to drive current across the channel, the current rises until it reaches saturation. Decreased carrier mobility and scattering is responsible for setting the saturation level. Unfortunately, when the dopant is in sufficiently high concentrations, it acts as a physical interference to the electrons 304 in the current stream flowing through the channel region 302 of the substrate, as electrons in the current stream are scattered and cannot efficiently flow across the channel. Hence, the maximum amount of current the channel can carry, $I_{dsat}$ is limited. The low current capability $I_{dsat}$ in the prior art is a serious limitation on semiconductor devices.

Complicating these limitations in the prior art is the fact that nMOSFET devices are approaching a channel length near the 0.1 micrometer range. For devices this small to be effective, a very thin gate oxide and a very high channel doping concentration is required. These features cause severe performance degradation due to impurity scattering and highly-impeded carrier mobility in the high transverse electric fields at the Silicon/Silicon-dioxide interface. These large transverse electric fields lead to quantum mechanical (QM) effects that reduce the inversion layer charge density at a given gate voltage. Hence, the magnitude of the threshold voltage $V_T$ increases. The overall impact of QM effects is the degradation of device performance. Due to these characteristics, conventional scaling of MOSFET devices to the desired smaller size is ineffective.

Thus, a need exists for a semiconductor device and formation method which provides a sufficient channel-region doping concentration such that a reduced threshold voltage can be used to achieve a desired current flow. Still another need exists for a semiconductor device and formation method that meets the above two needs but does not suffer unreasonable leakage current in the shut-off mode. A further need exists for a semiconductor device and formation method that meets the above need but that also does not suffer from highly-impeded carrier mobility. Finally, a need exists for a device with improved subthreshold swing that will enable faster device switching from the on-state to the off-state and vice versa.

DISCLOSURE OF THE INVENTION

The present invention provides a semiconductor device and formation method that has a channel-region doping that provides a reduced threshold voltage for a desired current flow. The present invention further provides a semiconductor device and formation method that has a highly effective carrier mobility. The present invention also provides a semiconductor device that does not suffer from unreasonable leakage in the shut-off mode.

Specifically, in one embodiment, the present invention recites a method for forming an enhanced channel-region doping profile, comprising of two principal steps. The first step is to provide a semiconductor substrate on which the doping process can be performed. The second step is to create a doping profile into the channel-region of the semiconductor substrate. More specifically, the doping profile is created by a) performing a first doping implantation with a first dopant in a first concentration to a first depth within the semiconductor substrate, and b) performing a second doping implantation with a second dopant in a second concentration to a second depth within the semiconductor substrate. As a result, a semiconductor substrate having an enhanced channel-region doping profile is formed.

In another embodiment, the present invention is a semiconductor device having an enhanced channel-region doping profile. The present embodiment comprises a semiconductor substrate. Within the semiconductor substrate is a channel-region with an enhanced channel-region doping profile. The present embodiment further comprises a first channel-region with a first dopant-concentration and a second channel-region with a second dopant-concentration. The present invention has high current capability at a lower threshold voltage, has improved carrier mobility, has a lower subthreshold slope for faster switching, and has low leakage-current in the shut-off mode.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

Prior Art

The drawings referred to in this description should be understood as not being drawn to scale except as specifically noted.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The following discussion will pertain to cross-sectional views of a semiconductor device in various states of fabrication, wherein the method of forming a semiconductor device having an enhanced channel-region is illustrated.

Figure 4A:
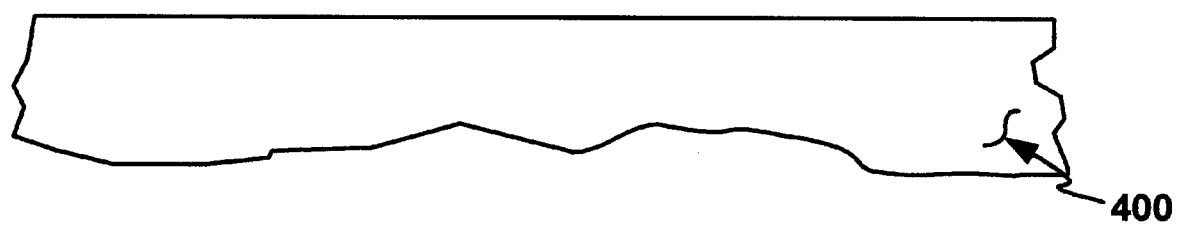
FIG. 4A is a side-sectional view illustrating a semiconductor substrate.

With reference now to FIG. 4A, the semiconductor device originates with a semiconductor substrate 400 such as silicon. Although silicon is recited as the semiconductor substrate in the present embodiment, the present invention is well-suited to the use of various other materials for the semiconductor substrate. The semiconductor substrate usually begins with a ready-made silicon wafer obtained from a vendor.

Figure 4B:
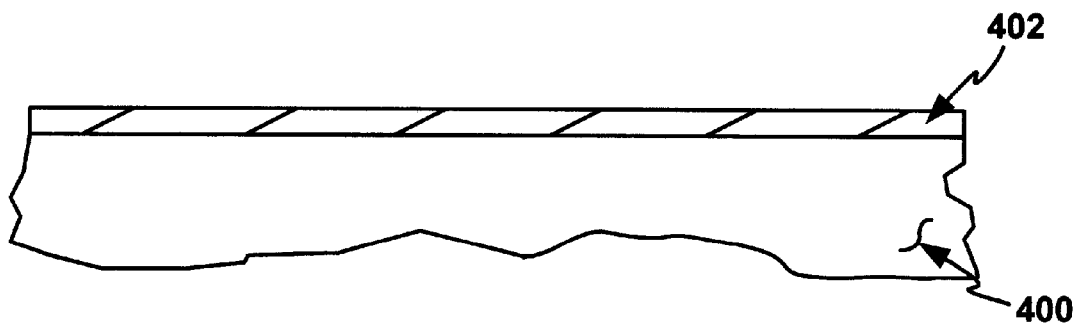
FIG. 4B is a side-sectional view of the structure of FIG. 4A having a pad-oxide layer.

With reference to FIG. 4B, a sacrificial layer of pad-oxide 402 is formed over the surface of the semiconductor substrate. This pad-oxide is provided as an intermediate step, selectively etched to define the areas of doping, and the location of a gate. The pad-oxide layer is created from a chemical process whereby silicon reacts with oxygen at high temperatures to form $SiO_2$. This process is well known in the prior art. Although the pad-oxide layer is recited in the present embodiment, the present invention is also well-suited to alternative methods and materials for masking and for insulating adjacent components of the transistor.

Figure 4C:
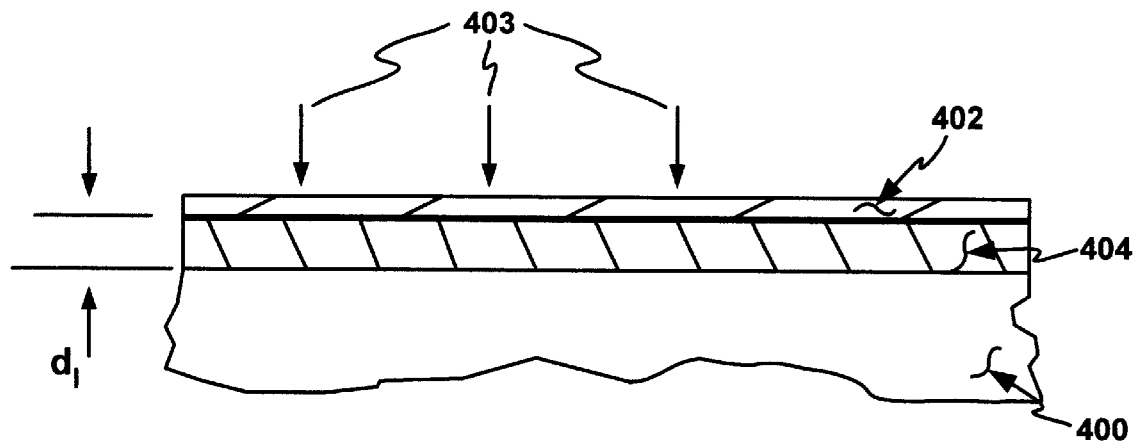
FIG. 4C is a side-sectional view of the structure of FIG. 4B having a lightly-doped channel-region.

Subsequently, in FIG. 4C, an n-dopant such as phosphorus 403 is implanted into the semiconductor substrate 400. The implanting process, well known in the prior art, is usually performed at elevated temperatures for a given period of time so that atoms of the dopant can diffuse into the substrate material. The implanting process only allows the dopant 403 to reach a depth of approximately $d_1$ in the semiconductor substrate 400. The depth $d_1$ is usually insufficient when compared to the depth required to create an adequately sized channel region for current flow, a depth of approximately 0.4 micrometers. Hence, the dopant must be driven further in to the semiconductor substrate 400.

Figure 4D:
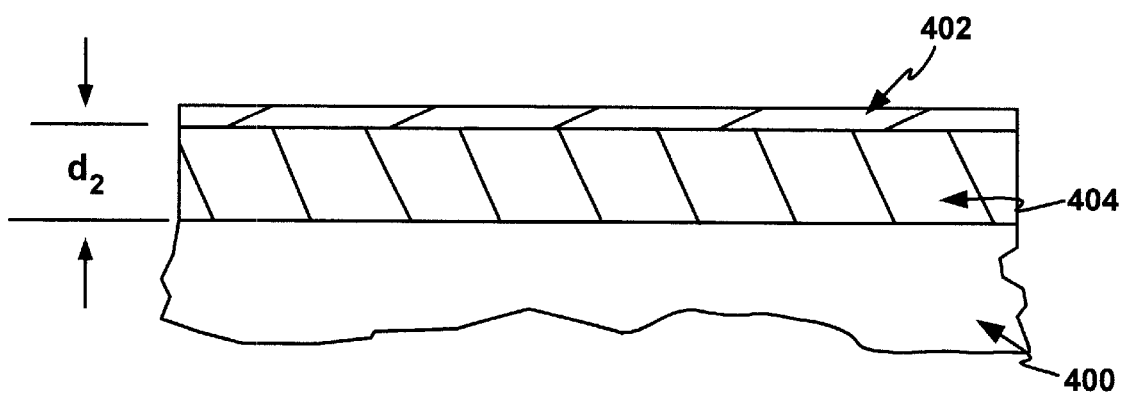
FIG. 4D is a side-sectional view of the structure of FIG. 4C having undergone a thermal cycle that extended the depth of the lightly-doped channel-region.

Referring now to FIG. 4D, the doped semiconductor substrate is subjected to a temperature cycle to drive the dopants deep into the substrate. The temperature cycle activates the implanted dopants. Additionally, the temperature cycle helps diffuse the dopants implanted near the surface of the semiconductor substrate further into the body of the substrate. Hence, the dopant is driven to a depth $d_2$ in the semiconductor substrate of approximately 0.4 micrometers and a concentration of approximately $5 \times 10^{17}$ per $cm^3$. This step results in the formation of a channel region 404. The concentration of dopant for most of the channel region is lower in the present invention than the concentration used in the standard profile of the prior art. It is this lower concentration that allows an improved threshold voltage, $V_T$. The lower concentration also improves the maximum current capability of the device, $I_{DSAT}$, because of improved carrier mobility. A specific example of a temperature cycle is a Rapid Thermal Anneal (RTA) process.

Figure 4E:
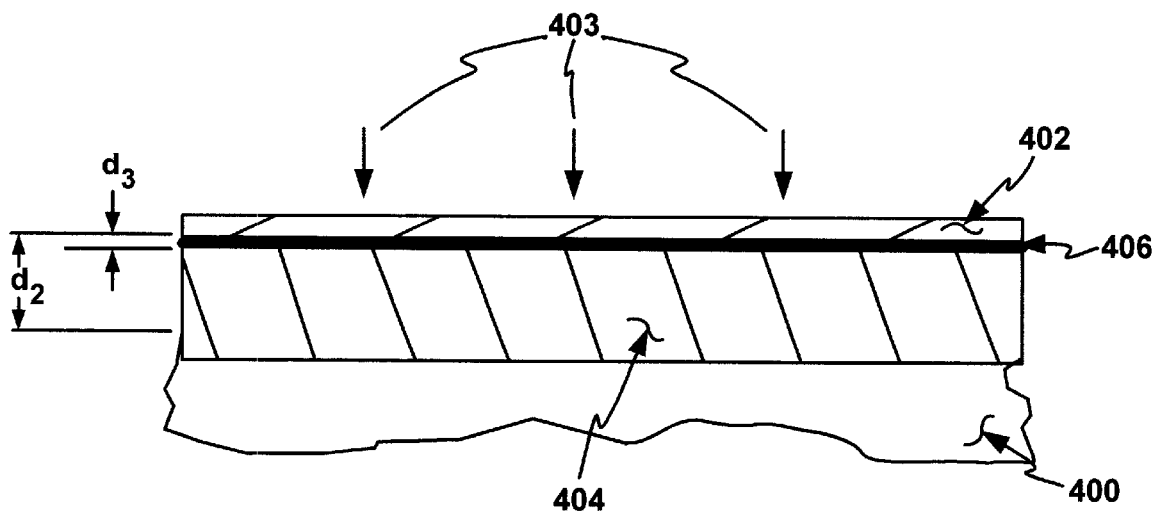
FIG. 4E is a side-sectional view of the structure of FIG. 4D having a highly-doped portion of the channel-region superpositioned on the lightly-doped portion of the channel-region.

Referring now to FIG. 4E, a second doping operation is performed. This may be referred to as a super-shallow implantation because it creates a channel region that is very close to the surface of the semiconductor substrate. In this process, an n-dopant such as phosphorus is implanted into the semiconductor substrate 400 to a concentration of approximately $1 \times 10^{18}$ per $cm^3$. This step results in the formation of a super-shallow channel region 406. Because the desired depth $d_3$ of the second doping operation is only approximately 20 nanometers, an RTA process is not required. Although an RTA process is not employed in the present embodiment, the present invention is also well-suited to an embodiment in which super-shallow channel region 406 is subjected to an RTA process.

The second doping operation that only extends to a shallow depth provides a lower value for the s-factor. The lower s-factor means the device shuts off more positively when the bias voltage on the gate nears zero and hence, the inversion layer dissipates. In another regard, to create an inversion layer in the super-shallow region having a higher concentration of dopant, a higher bias voltage, one greater than that for an equivalent region of lower-concentration, is required. Thus, unlike the prior art that may have current leakage in the transistor's shut-off mode, the present invention more positively turns off current flow as a result of its enhanced profile.

In the present embodiment, the dopant used in the first and second doping operations is the same material. However, the present invention is well-suited to the use of different dopant materials for each doping operation.

Figure 1:
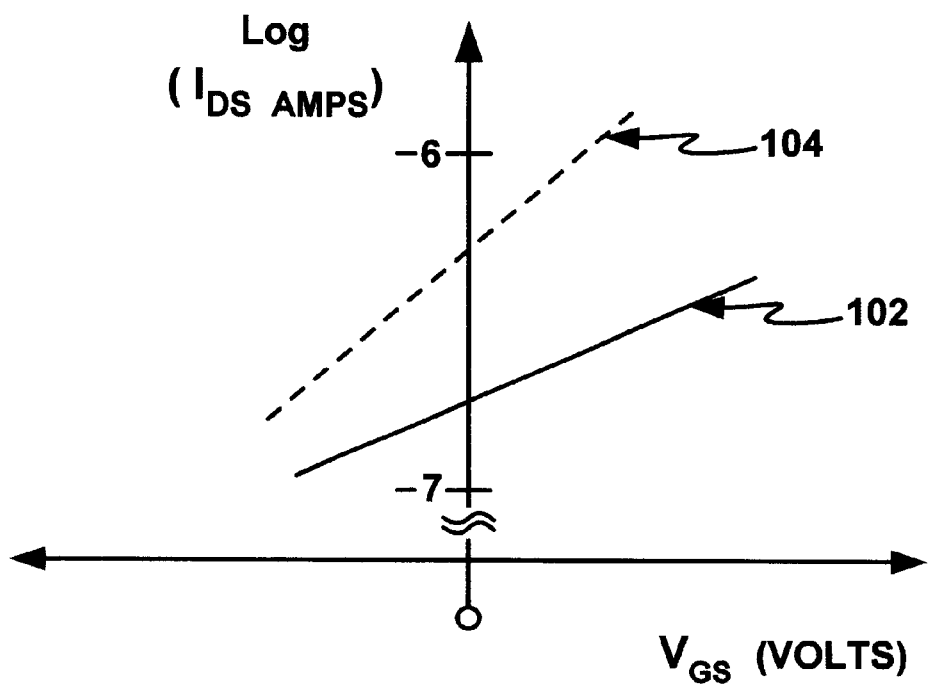
FIG. 1 is a graph showing Logarithm of $I_{ds}$ current vs. $V_{GS}$ voltage.
Figure 2:
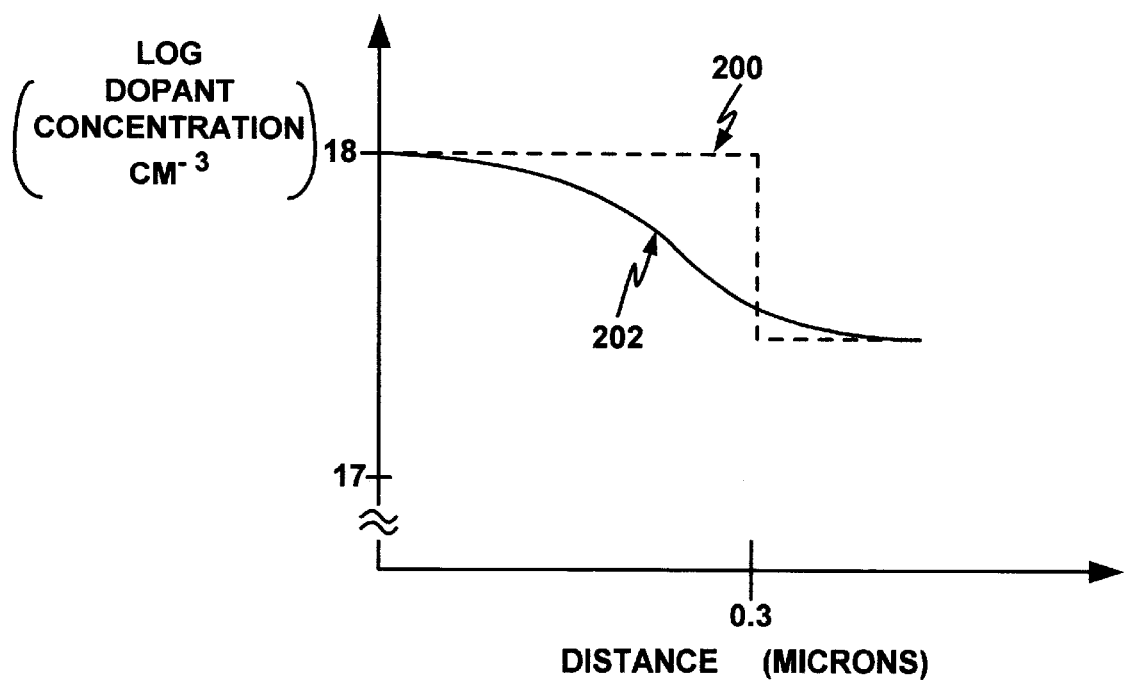
FIG. 2 is a graph showing Logarithm of Dopant concentration vs. Distance in the semiconductor substrate.
Figure 3:
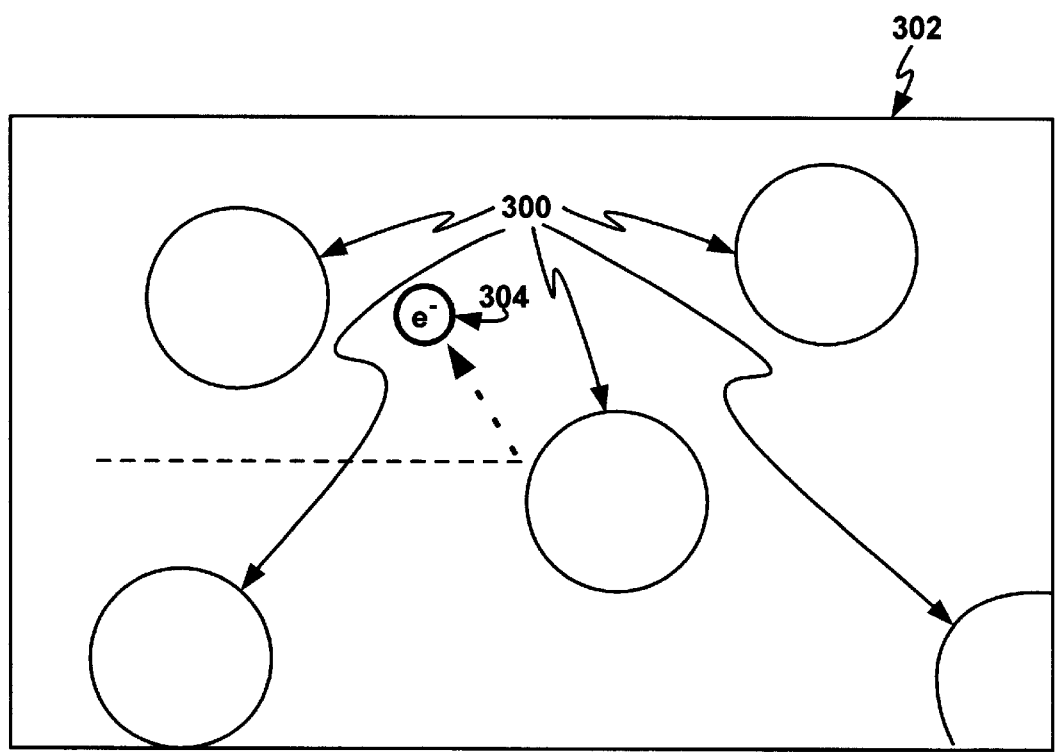
FIG. 3 illustrates Electron-Dopant Scattering Interference in a channel-region of a conventional semiconductor device
Figure 5:
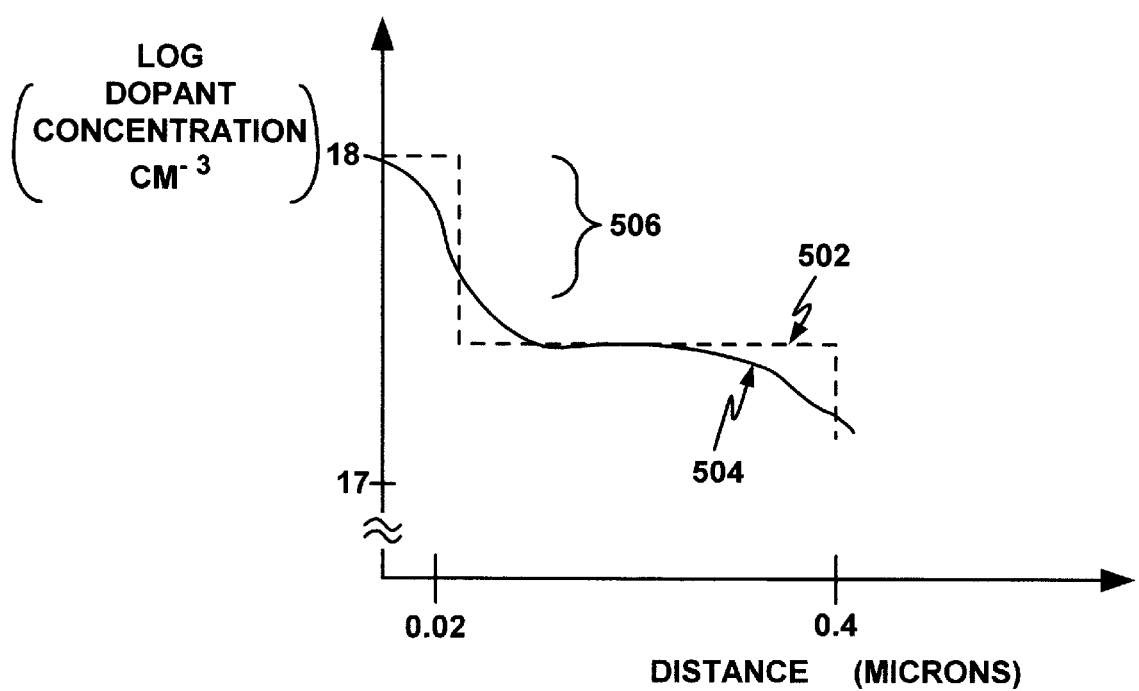
FIG. 5 is a is a graph for the Enhanced Channel-Region Doping profile showing: Depth in the semiconductor substrate vs. Dopant concentration.

Referring to FIG. 5, a doping profile representative of the doping operations is presented. The ideal curve 502 represents a theoretical doping process that would allow discrete doping regions. However, actual curve 504 more realistically represents manufacturing technology and material behavior. The high surface-concentration is represented by segment 506 of each curve. It is this high surface-concentration profile that allows the present invention to perform with an S-factor related to the ideal slope 104 illustrated in Prior Art FIG. 1.

As a result, the present invention does not suffer from the poor switching performance, excessive gate-swing and low saturated current from impeded mobile carriers, all of which limit the prior art. Although the dopant, concentration, and depth of implantation for each doping operation is recited in the present embodiment, the present invention is also well-suited to doping the substrate with a variety of dopants, to a range of depths, and with a range of concentrations.

Subsequent operations can be performed on the device to bring it to a more usable form. These operations are well known in the state of the art. They primarily include gate and source-drain formations on each side of the channel region, and creation of contacts to the drain, source, gate, and body of the device. Thus, for example, a gate may be formed by vapor deposition, or equivalent technique, using a material such as metal in an area above the channel region. Additionally, source-drain formations may be created on both ends of the channel to complete the basic transistor construction. While the gate masks the channel from the dopant, areas beyond the gate are exposed to the dopant, and thus form wells with a desired concentration of impurities. These additional steps provide a recognizable MOSFET device.

Referring again to FIG. 4E, a side-sectional view of a channel-region of a semiconductor device having an enhanced channel-region doping profile in accordance with the present invention is shown. In this embodiment, the device comprises a channel region having an enhanced doping profile formed in a silicon substrate 400. Specifically, the device has a channel-region 404 with a dopant concentration of approximately $5 \times 10^{17}$ per $cm^3$ to a depth $d_1$ of approximately 0.4 micrometers. The device also has a second channel-region 406 with a dopant concentration of approximately $1 \times 10^{18}$ per $cm^3$, but only to a depth $d_3$ of approximately 20 nanometers.

Figure 6A:
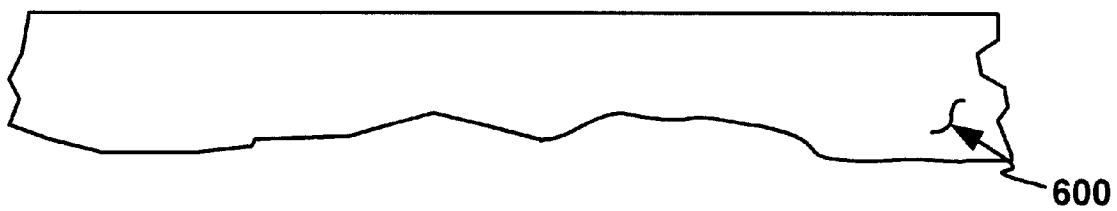
FIG. 6A is a side-sectional view illustrating a semiconductor substrate.

With reference now to FIG. 6A, another embodiment of the present invention is illustrated. The semiconductor device originates with a semiconductor substrate 600 such as silicon. Although silicon is recited as the semiconductor substrate in the present embodiment, the present invention is will suited to the use of various other materials for the semiconductor substrate. The semiconductor substrate usually begins with a ready-made silicon wafer obtained from a foundry.

Figure 6B:
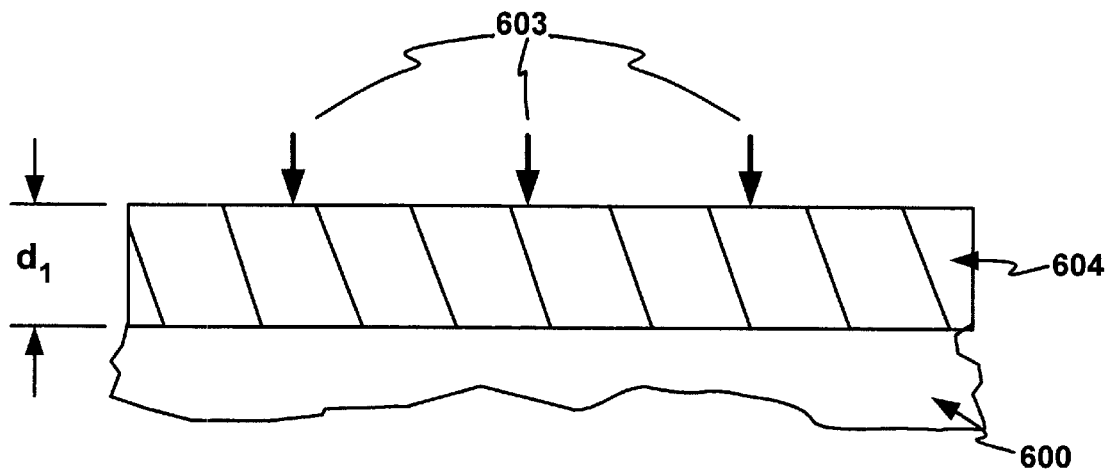
FIG. 6B is a side-sectional view of the structure of FIG. 6A having a lightly-doped channel-region.

Subsequently, in FIG. 6B, an n-dopant such as phosphorus 603 is implanted into the semiconductor substrate 600. The implanting process is performed such that dopant 603 reaches the desired depth $d_1$ of approximately 0.4 micrometers and a concentration of approximately $5 \times 10^{17}$ per $cm^3$. This step results in the formation of channel region 604.

Figure 6C:
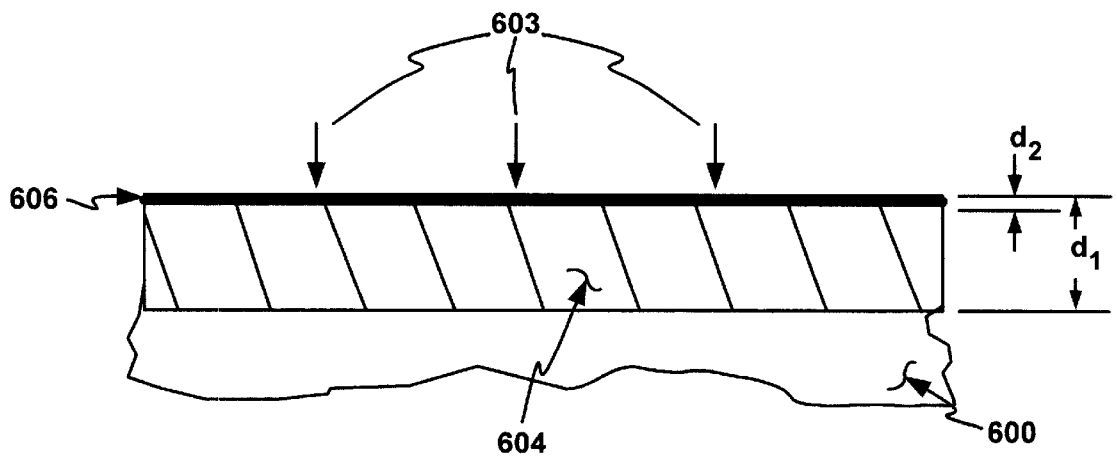
FIGS. 6C and 6D are side-sectional views of the structure of FIG. 6B having a highly-doped channel-region superpositioned on the lightly-doped channel-region.

Referring now to FIG. 6C, a second doping operation is performed. This may be referred to as a super-shallow implantation because it is so close to the surface of the semiconductor substrate. In this process, an n-dopant such as phosphorus 603 is implanted into the semiconductor substrate 600 to a concentration of approximately $1 \times 10^{18}$ per $cm^3$. This step results in the formation of super-shallow channel region 606. Because the desired depth $d_2$ of the second doping operation is only approximately 20 nanometers, a temperature cycle process is not required. Although an RTA process is not employed in the present embodiment, the present invention is also well-suited to an embodiment in which super-shallow channel region 406 is subjected to an RTA process. The dopant is activated by the subsequent process of source-drain formation that is known in the prior art.

Figure 6D:
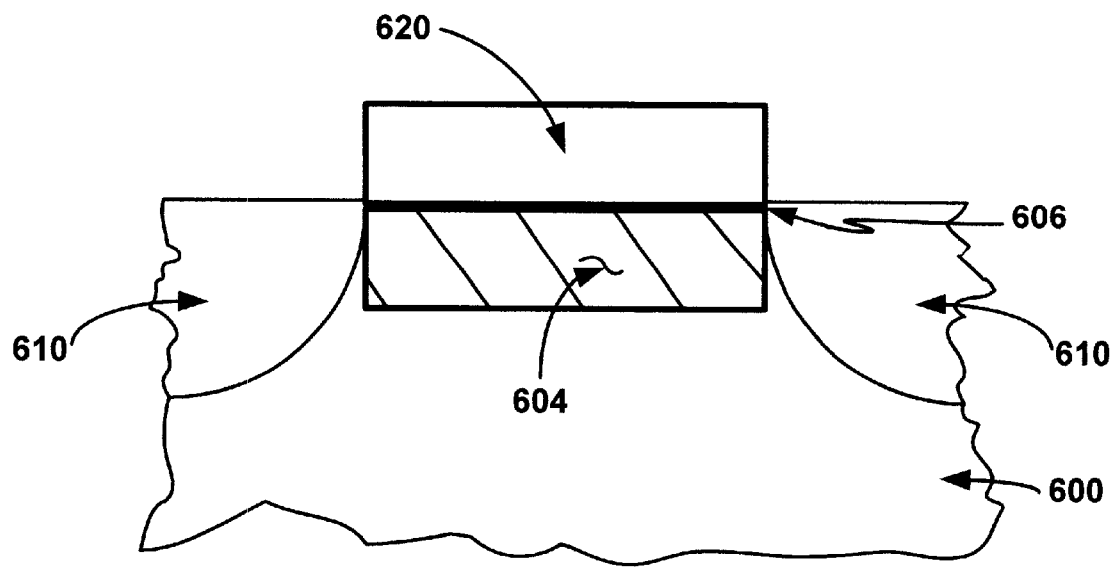

FIG. 6*d*, illustrates a semiconductor device that includes a gate 620 and source-drain formations 610 on each side of the channel region.

The second doping operation that only extends to a shallow depth provides a lower slope for the s-factor. The lower slope means the device shuts off more positively when the bias voltage on the gate nears zero and hence, the inversion layer dissipates. To create an inversion layer in the super-shallow region with the higher concentration of dopant, a bias voltage higher than that required for an equivalent region of lower-concentration is required. Thus, unlike the prior art that may have current leakage in the transistor's shut-off mode, the present invention more positively turns off current flow as a result of its enhanced profile.

In the present embodiment, the dopant used in the first and second doping operations is the same material. However, the present invention is well-suited to the use of different doping materials for each doping operation.

While the present embodiment implies an n-MOS transistor configuration, the present invention is also well-suited to other configurations. For example, the concepts of the present invention are equally suited to forming a p-MOS or c-MOS transistor, and incorporation of these devices into integrated circuits and very large scale integration.

In summary, the present invention provides a semiconductor device and formation method with an enhanced channel-region doping profile. The enhanced profile reduces the threshold voltage required to achieve a desired current flow. The present invention also provides a semiconductor device and formation method that does not suffer unreasonable leakage current in the shut-off mode. Furthermore, the present invention provides a semiconductor device and formation method that does not suffer from highly-impeded carrier mobility. Finally, provides a semiconductor device and formation method with improved subthreshold swing that will enable faster device switching from the on-state to the off-state and vice versa.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, to thereby enable others skilled in the art best to utilize the invention and various embodiments with various modifications as are suited to the particular use contemplated. It is intended that the scope of the invention be defined by the Claims appended hereto and their equivalents.

What is claimed is:

1. A semiconductor device having an enhanced channel-region doping profile, said semiconductor device comprising:

a) a semiconductor substrate, said semiconductor substrate configured to have a semiconductor device formed therein;

b) a channel-region, said channel-region having an enhanced doping profile disposed within said semiconductor substrate, and said enhanced channel-region further comprising a first doped region of a first dopant in a first concentration to a first depth and a second doped region of a second dopant in a second concentration to a second depth, where said second depth is less than said first depth, said channel-region not substantially extending laterally beyond a region over which a gate will subsequently be formed, said channel-region further bounded by respective source and drain formations, where said first concentration is approximately $5 \times 10^{17}$ dopant-particles/cm$^3$, and where said second concentration is approximately $1 \times 10^{18}$ dopant-particles/cm$^3$.

2. The semiconductor device having an enhanced channel-region doping profile as recited in claim 1, wherein said second dopant is the same as said first dopant.

3. The semiconductor device having an enhanced channel-region doping profile as recited in claim 1, wherein said first depth is approximately 0.4 micrometers.

4. The semiconductor device having an enhanced channel-region doping profile as recited in claim 1, wherein said second depth is approximately 20 nanometers.

* * * * *